(12) United States Patent
Canard et al.

(10) Patent No.: US 7,038,496 B2
(45) Date of Patent: May 2, 2006

(54) DEVICE FOR COMPARISON OF FREQUENCIES WITH LOW TEMPORAL INERTIA

(75) Inventors: David Canard, Caen (FR); Vincent Fillatre, Thaon (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/995,470

(22) Filed: Nov. 28, 2001

(65) Prior Publication Data

US 2002/0113625 A1  Aug. 22, 2002

(30) Foreign Application Priority Data

Nov. 28, 2000 (FR) .................................. 00 15356

(51) Int. Cl.
*G01R 23/02* (2006.01)
(52) U.S. Cl. .................. 327/47; 327/49; 327/7; 327/12
(58) Field of Classification Search .................. 327/40, 327/3, 5, 7, 8, 12, 39, 42, 43, 47–49, 144–148, 327/155–157, 162, 163, 2; 331/25; 324/76.52, 324/76.53, 76.77, 76.57
See application file for complete search history.

(56) References Cited

U.S. PATENT DOCUMENTS

| | | | | |
|---|---|---|---|---|
| 4,403,193 A | * | 9/1983 | Takemura | 327/4 |
| 4,849,704 A | * | 7/1989 | Thornton | 327/5 |
| 4,851,784 A | * | 7/1989 | Wells et al. | 327/12 |
| 4,904,948 A | * | 2/1990 | Asami | 327/12 |
| 4,959,617 A | * | 9/1990 | Martin | 327/12 |
| 5,103,191 A | * | 4/1992 | Werker | 331/1 A |
| 5,216,374 A | | 6/1993 | George et al. | 328/14 |
| 5,376,847 A | * | 12/1994 | Staszewski | 327/12 |
| 5,521,948 A | * | 5/1996 | Takeuchi | 375/376 |
| 5,592,110 A | * | 1/1997 | Noguchi | 327/12 |
| 5,631,582 A | * | 5/1997 | Fujikawa | 327/12 |
| 5,638,410 A | * | 6/1997 | Kuddes | 375/357 |
| 5,699,387 A | * | 12/1997 | Seto et al. | 375/376 |
| 5,825,640 A | * | 10/1998 | Quigley et al. | 363/60 |
| 5,854,575 A | * | 12/1998 | Fiedler et al. | 331/10 |
| 5,877,641 A | * | 3/1999 | Ziegler et al. | 327/156 |
| 5,889,437 A | * | 3/1999 | Lee | 331/16 |
| 5,945,855 A | * | 8/1999 | Momtaz | 327/157 |
| 5,963,059 A | * | 10/1999 | Partovi et al. | 327/12 |

(Continued)

FOREIGN PATENT DOCUMENTS

EP    0283160 A2    9/1988

(Continued)

*Primary Examiner*—Kenneth B. Wells
*Assistant Examiner*—Hai L. Nguyen
(74) *Attorney, Agent, or Firm*—Michael J. Ure

(57) ABSTRACT

The present invention relates to a device for comparison CMP, which is designed to emit a control signal Vcnt, which is representative of a difference which exists between the input signal frequencies Vdiv and Vref. The device according to the invention includes a phase/frequency comparator PD, which supplies a regulation signal Tun, which is subjected to pulse width modulation according to the difference observed. The device also includes a current source, which is designed to emit a charge current Ics, with a value which is controlled by the regulation signal Tun. The device further includes a capacitive element Cs, which is designed to generate the control signal Vcnt, under the effect of the charge current Ics. By means of a regulation signal Tun, which has a frequency which is virtually constant, the invention makes it possible to impose high-frequency variations on the control signal Vcnt.

4 Claims, 2 Drawing Sheets

U.S. PATENT DOCUMENTS

| | | | | |
|---|---|---|---|---|
| 6,157,218 A * | 12/2000 | Chen | | 327/7 |
| 6,218,868 B1 * | 4/2001 | Katoh | | 327/12 |
| 6,229,361 B1 * | 5/2001 | Henwood | | 327/145 |
| 6,256,362 B1 * | 7/2001 | Goldman | | 375/373 |
| 6,337,976 B1 * | 1/2002 | Kudou | | 455/258 |
| 6,389,092 B1 * | 5/2002 | Momtaz | | 375/376 |
| 6,470,060 B1 * | 10/2002 | Harrison | | 375/374 |
| 6,512,801 B1 * | 1/2003 | Ninomiya | | 375/316 |
| 6,522,183 B1 * | 2/2003 | Sumi | | 327/159 |
| 6,608,509 B1 * | 8/2003 | Mizuno et al. | | 327/149 |
| 6,680,653 B1 * | 1/2004 | Griffith et al. | | 331/17 |
| 6,683,930 B1 * | 1/2004 | Dalmia | | 375/376 |

FOREIGN PATENT DOCUMENTS

| | | |
|---|---|---|
| EP | 0519562 A2 | 12/1992 |
| EP | 0855802 A2 | 7/1998 |

* cited by examiner

DEVICE FOR COMPARISON OF FREQUENCIES WITH LOW TEMPORAL INERTIA

TECHNICAL FIELD OF THE INVENTION

The present invention relates to a device for comparison, which is designed to receive a first and a second input signal, and to emit a control signal which is representative of a frequency difference which exists between the said signals.

BACKGROUND OF THE INVENTION

Devices of this type are commonly used in order to control oscillation frequencies of frequency synthesizers, particular in radio signal receiver devices such as televisions, decoder boxes or cellular telephones, in which devices the frequency conversions are carried out by mixing signals to be converted with output signals of these synthesizers. A device for comparison, which is designed to control a frequency synthesizer, is known in particular from patent U.S. Pat. No. 5,216,374. As the first and second input signal, this device is designed to receive an output signal of an oscillator, and a reference signal. By means of a microcontroller, the known device calculates the frequency difference which exists between the input signals, and generates a digital control signal, which comprises a succession of pulses, which have width which is determined by the result of the said calculation. The digital control signal is then converted into an analogue voltage, and is applied to a control input of the oscillator, in order to adjust the frequency of its output signal. The known device thus uses digital circuitry which has a very complex structure, in order to produce a quantitative measurement of the frequency difference between the input signals, and to translate the result of this measurement into modulation of the width of the pulses of the control signal. Circuitry of this type has major design problems, owing in particular to the lengthy response times caused by its complexity. In addition, the known structure is difficult to produce in the form of a single integrated circuit, which makes it costly to produce, and difficult to use.

The object of the present invention is to eliminate these disadvantages, by providing a device for comparison which is provided with a very simple structure, which is easy to integrate, and the response time of which is very low.

SUMMARY OF THE INVENTION

In fact, a device for comparison according to the introductory paragraph includes, according to the invention:
a phase/frequency comparator, which is designed to receive the first and second input signals, and to emit a regulation signal;
at least one current source, which is designed to emit a charge current, which has a value which is variable according to the regulation signal; and
a capacitive element, which is designed to have the said charge current pass through it, and is designed to generate the control signal, the phase/frequency comparator being arranged such that the regulation signal comprises a succession of pulses, each of which has a width which is modulated according to the frequency difference which exists between the first and second input signals.

The device for comparison according to the invention does not require quantitative measurement of the frequency difference which exists between its input signals. A difference of this type gives rise automatically to a variation in the width of the pulses of the regulation signal, which variation gives rise in turn to a variation in the value of the charge current, in the manner of the process which occurs in conventional phase-locked loops. The invention is distinguished in that, by means of a regulation signal which has a virtually constant frequency, it makes it possible to impose high-frequency variations on the control signal, by means of high-frequency modulation of the width of the pulses of the regulation signal.

Thus, by means of the invention, a current source with a conventional structure can produce a charge current which has high-frequency variations, without the said current source itself being required to switch to high frequencies.

According to a particular embodiment of the invention, the phase/frequency comparator includes a flip-flop RS, the inputs of which for setting to one and to zero are piloted respectively by the first and second input signals, and an output of which is designed to emit the control signal.

According to this embodiment, which is advantageous owing to its simplicity, the width of the pulses of the regulation signal is modulated by the flip-flop RS, which is a component which is inexpensive and easy to integrate.

The invention will advantageously be used to control a frequency synthesiser, which includes:
an oscillator, which is designed to emit an output signal, with an oscillation frequency which is controlled by means of a control signal; and
a device for comparison as previously described, the first and second input signals of which are constituted respectively by the output signal of the oscillator and a reference signal, which device is designed to supply the control signal to the oscillator.

As previously stated, in one of its embodiments, the invention also relates to a device which is designed to receive radio signals, including:
an input stage which is designed to receive a radio signal, and to convert the said signal into an electronic output signal, with a frequency which is known as a radio frequency;
a frequency synthesizer as previously described, which is designed to emit an output signal, and has a frequency known as an oscillation frequency; and
a mixer, which is designed to receive the output signals of the input stage and of the frequency synthesizer, and to emit a signal with a frequency which is equal to a difference between the radio frequency and the oscillation frequency.

Finally, more generally, the invention relates to a method for controlling an oscillation frequency of an oscillator with controlled voltage, including the following stages:
processing of a regulation signal which comprises a succession of pulses, each of which has a width which is modulated according to a frequency difference which exists between a first and a second signal;
use of the said regulation signal in order to pilot at least one current source, which is designed to emit a charge current; and
use as a control signal of a voltage which is generated by a capacitive element, through which the said charge current passes.

BRIEF DESCRIPTION OF THE DRAWINGS

The invention will be better understood by means of the following description, provided by way of non-limiting example with reference to the attached drawings, in which.

DETAILED DESCRIPTION OF THE INVENTION

Figure 1:
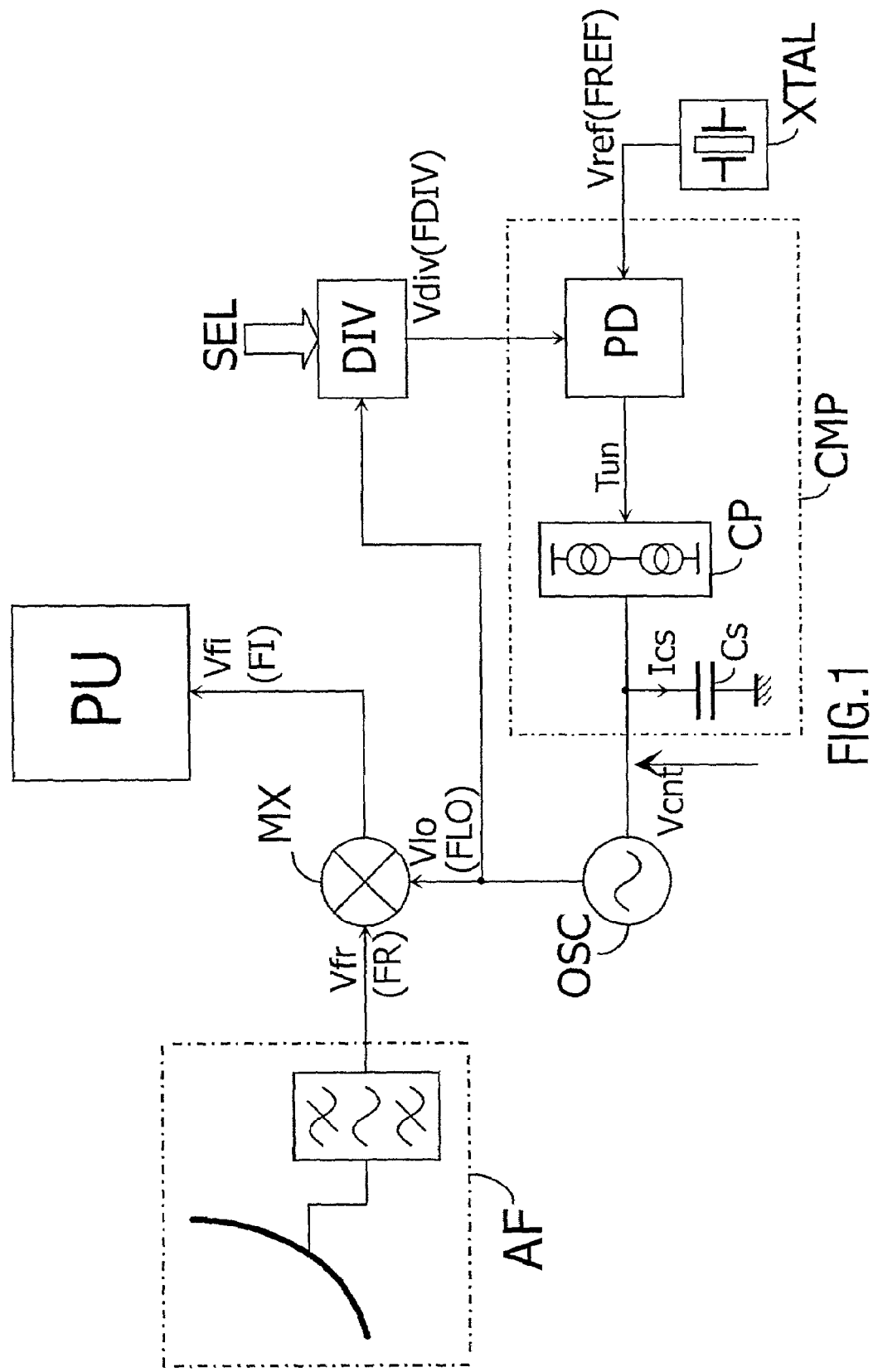
FIG. 1 is a partial block diagram, describing a receiver device for radio signals, which implements the invention.

FIG. 1 represents schematically a radio signal receiver device, for example a television, a decoder box, or a cellular telephone.

This device includes:

an input stage AF, which in this example is an antenna and filtering system, which is designed to receive a radio signal, and to convert the said signal into an electronic output signal Vfr, with a frequency FR which is known as a radio frequency;

a frequency synthesizer (OSC, CMP), which is designed to emit an output signal Vlo, with a frequency FLO which is known as an oscillation frequency; and a mixer MX, which is designed to receive the output signals Vfr and Vlo of the input stage AF and of the frequency synthesizer (OSC, CMP), and to emit a signal Vfi with a frequency FI, which is known as the intermediate frequency, and is equal to a difference between the radio frequency FR and the oscillation frequency FLO.

According to a known technique, the choice of the oscillation frequency FLO permits selection of the radio frequency FR. In fact, the value of the intermediate frequency FI is fixed by a selective filtering system, which is not represented in the Figure. Thus, since FI=FR−FLO, FR=FI−FLO applies. In the device described herein, the frequency synthesizer includes:

an oscillator OSC, which is designed to emit the output signal Vlo of the synthesizer, the oscillation frequency FLO of which is controlled by means of a control signal Vcnt; and a device for comparison CMP according to the invention, the first and second input signals of which are constituted respectively by a signal Vdiv derived from the output signal Vlo of the oscillator OSC, and a reference signal Vref, which device CMP is designed to supply the control signal Vcnt to the oscillator OSC.

The reference signal Vref can for example be generated by a quartz oscillator XTAL, the frequency FREF of which is perfectly controlled.

The device for comparison CMP is constructed such that, when it detects a difference between the frequencies of its first and second input signals Vdiv and Vref, it gives rise to variation of the control signal Vcnt, thus making it possible to adjust the oscillation frequency FLO, such that the difference detected by the device for comparison CMP disappears.

In the example now described, a frequency divider DIV is inserted between the output of the oscillator OSC and the device for comparison CMP. This frequency divider DIV is designed to carry out a division between the frequency FLO of its input signal Vlo, and the frequency FDIV of its output signal Vdiv, the ratio of which, which is known as R, wherein R=FLO/FDIV, is determined by the user of the device by means of a selection signal SEL. The presence of this frequency divider DIV makes it possible to introduce a degree of freedom in the choice of the oscillation frequency FLO, and thus in the selection of the radio frequency FR. In fact, in a condition of balance, FDIV=FREF, and thus FLO=R.FREF, or also FR=FI.R.FREF.

The device for comparison CMP described in this embodiment of the invention includes:

a phase/frequency comparator PD, which is designed to receive the first and second input signals Vdiv and Vref, and to emit a regulation signal Tun;

a charge pump CP, which includes two current sources, and is designed to emit a charge current Ics, with a value which is variable according to the regulation signal Tun; and a capacitive element Cs, which is designed to have the charge current Ics pass through it, and to generate the control signal Vcnt.

According to the invention, the phase/frequency comparator PD is designed such that the regulation signal Tun comprises a succession of pulses, each of which has a width which is modulated according to the frequency difference which exists between the first and second input signals Vdiv and Vref.

Thus, when the device for comparison CMP detects differences between the frequencies of its input signals Vdiv and Vref, the regulation signal Tun has a variable cyclical ratio, known as K, which will give rise to variations in the value of the charge current Ics, and thus to variations in the control signal Vcnt. A positive current Ics will give rise to a charge of the capacitive element Cs, and to an increase in the value of the control signal Vcnt, which will give rise to an increase in the oscillation frequency FLO. Conversely, a negative current Ics will give rise to discharge of the capacitive element Cs, and to a decrease in the value of the control signal Vcnt, which will give rise to a decrease in the oscillation frequency FLO.

The invention is distinguished in that, by means of a regulation signal Tun, which has a virtually constant frequency, it makes it possible to impose high-frequency variations on the control signal Vcnt, by means of high-frequency modulation of the width of the pulses of the regulation signal Tun, and thus of the cyclical ratio K of the said signal.

Thus, by virtue of the invention, a charge pump Cp with a conventional structure, the frequency of which is known to be limited, can produce a charge current Ics which has high-frequency variations, without the said charge pump CP itself being required to switch to high frequencies. The invention thus makes it possible to increase the accuracy of the regulation of the frequency of the output signal of a synthesizer, particularly at high frequencies, of approximately a GigaHertz, without increasing significantly the cost of the said synthesizer. The speed of response of the device for comparison CMP according to the invention is such that, in order to avoid excessive corrections which can seriously adversely affect the balance, it is advantageous to insert between the phase/frequency detector PD and the charge pump CP a low-pass filter, which is designed to produce a signal which is representative of an average value of the regulation signal Tun.

Figure 2:
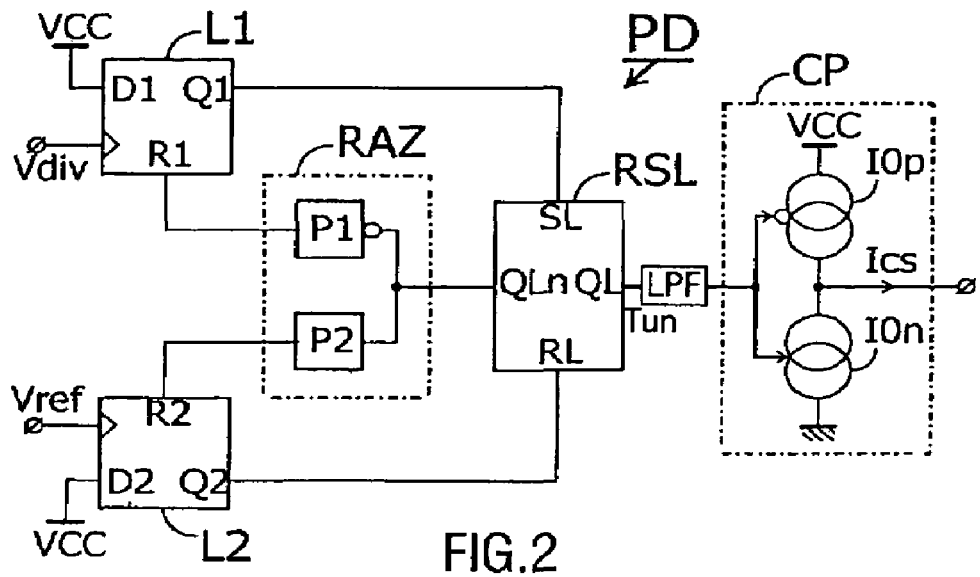
FIG. 2 is a block diagram, which describes partially a device for comparison according to an advantageous embodiment of the invention.

FIG. 2 is a block diagram which represents partially a device for comparison according to a particularly advantageous embodiment of the invention. This device comprises a phase/frequency comparator PD and a charge pump CP.

The charge pump CP includes a first and a second current source, IOp and IOn, which are disposed in series between a positive supply terminal VCC and a ground, and are designed to emit alternately a current IO according to the value of the regulation signal Tun. An intermediate node for the said current sources constitutes an output of the charge pump CP, which is designed to emit a charge current Ics, which can be positive or negative. In the example now described, the first current source IOp will be conductive when the regulation signal Tun has a logic level 0, whereas the second current source IOn will be conductive when the regulation signal Tun has a logic level 1. The first and second current sources IOp and IOn will then advantageously be produced on the basis of bipolar transistors of the PNP and NPN type respectively, or of MOS transistors of the PMOS and NMOS type.

Thus, the cyclical ratio K of the regulation signal Tun, defined as the ratio between the duration during which the signal has a logic level 1 and the duration of one of its periods, determines the average value of the current Ics. In fact, when K=0.5, the said average value of the current Ics is zero, since during the same period, the first and second current sources IOp and IOn are conducting for equal periods of time.

If K is lower than 0.5, the first current source IOp will be conducting for a longer period of time than the second current source IOn for the same period of the regulation signal Tun, and the average value of the charge current IOn will be positive, whereas if K is greater than 0.5, the second current source IOn will be conducting for a longer period of time than the first current source IOp for the same period of the regulation signal Tun, and the average value of the charge current Ics will be negative.

In this embodiment, the phase/frequency comparator PD includes a flip-flop RS, known as RSL, the inputs of which for setting to one and to zero, SL and RL, are piloted respectively by the first and second input signals Vdiv and Vref, and an output QL of which is designed to emit the control signal Tun. According to the known characteristics of flip-flops RS, when the input SL receives a logic level 1, the output QL will be set to the logic level 1, until the input RL in turn receives a logic level 1, which will have the effect of setting the output QL to the logic level 0.

The phase/frequency comparator PD described herein also includes:

a first and a second detector L1 and L2 of active fronts of the first and second input signals Vdiv and Vref, in this case constituted by memory flip-flops of the flip-flop type D, the data inputs D1 and D2 of which are connected to the positive supply terminal VCC, and the outputs Q1 and Q2 of which are connected respectively to the inputs for setting to one and to zero SL and RL of the flip-flop RSL; and means for re-initialization P1 and P2 of the first and second detectors L1 and L2, which are designed to deactivate one or the other of the said detectors L1 or L2, when the active front which it has detected has been taken into account by the flip-flop RSL. In this example, deactivation of a detector L1 or L2 will lead to setting to the logic level 0, of its output Q1 or Q2. The means for re-initialization can for example consist of pulse generators which are well known to persons skilled in the art, the outputs of which will be connected to re-initialization inputs R1 and R2 of the detectors L1 and L2.

In this phase/frequency comparator PD, an active edge of the first input signal Vdiv will give rise to a leading edge of the regulation signal Tun, whereas an active edge of the second input signal will give rise to a trailing edge of the regulation signal Tun. The condition of balance, during which the cyclical ratio K of the regulation signal Tun will be equal to 0.5, will therefore be reached when the first and second input signals Vdic and Vref are in phase opposition.

It will be appreciated that inversion of the wiring of the first and second current sources IOp and IOn, as well as of that of the inputs for setting to one and to zero SL and RL, is perfectly conceivable without giving rise to significant modifications of the device for comparison according to the invention.

Figure 3:
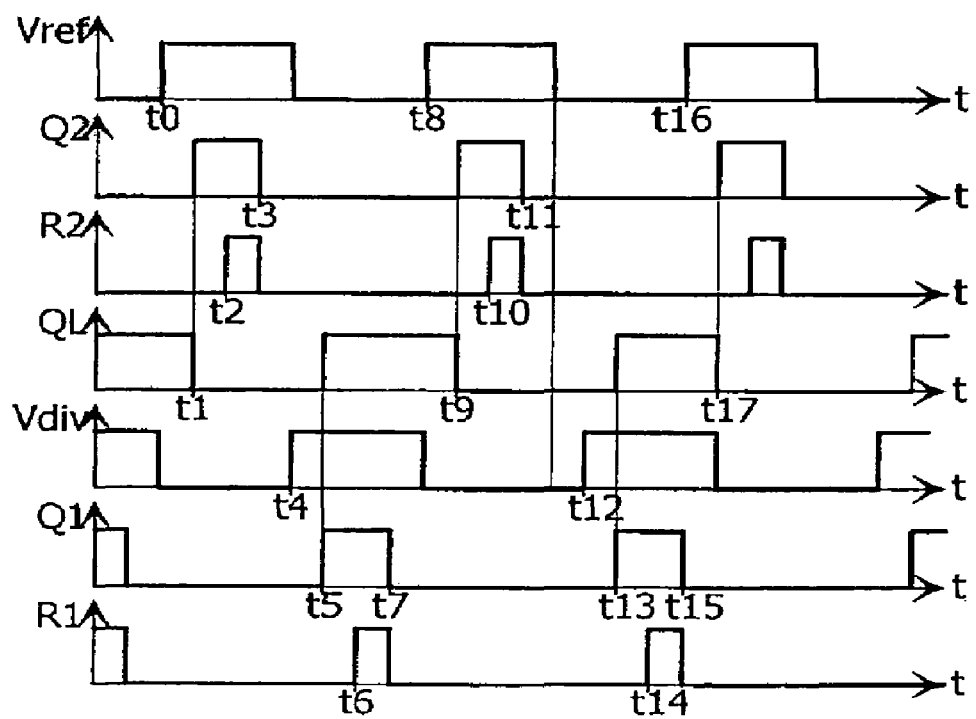
FIG. 3 is a series of timing diagrams, which describe the development of signals present in a device of this type.

FIG. 3 illustrates in the form of timing diagrams, the development of various signals which are present in the device for comparison previously described.

The second input signal of the device, which in this case takes the form of the reference signal Vref, is periodic, and has a cyclical ratio of 0.5, which is constant over a period of time. In the example described here, it has a leading edge at an instant t0. At an instant t1, which is separated from the instant t0 by a time interval tl2, caused by the temporal inertia of the detector L2, the output Q2 of the said detector has a logic level 1, and gives rise to resetting to zero of the output QL of the flip-flop RSL, as well as to setting to one of its complemented output Qln. At an instant t2, which is separated from the instantt1 by a time interval tp2, caused by the temporal inertia of the pulse generator P2, the re-initialization input R2 of the detector receives a logic level 1, which, at an instant t3, which is separated from the instant t2 by the time interval tl2, caused by the temporal inertia of the detector L2, gives rise to deactivation of the said detector L2, the output QL of the flip-flop RSL remaining at the logic level 0.

The second input signal of the device for comparison, which in this case takes the form of the output signal of the frequency divider Vdiv, is variable. In the example now described, during a first period, it is in phase opposition with the reference signal Vref, i.e. a condition of balance has been reached. The signal Vdiv has a leading edge at an instant t4. At an instant t5, which is separated from the instant t4 by an time interval tl1, caused by the temporal inertia of the detector L1, the output Q1 of the said detector has a logic level 1, and gives rise to setting to one of the output QL of the flip-flop RL, as well as to setting to zero of its complemented output QLn. At an instant t6, which is separated from the instant t5 by a time interval tp1, caused by the temporal inertia of the pulse generator P1, the re-initialization input R1 of the detector receives a logic level 1, which, at an instant t7, which is separated from the instant t6 by the time interval tl1, caused by the temporal inertia of the detector L1, gives rise to deactivation of the said detector L1, the output QL of the flip-flop RSL remaining at the logic level 1.

At an instant t8, the second input signal Vref has once more a leading edge, which, according to the explanations previously given, gives rise to setting to one, at an instant t9, of the output Q2 of the detector L2, and thus to resetting to zero of the output QL of the flip-flop RSL.

It can thus be noted that the cyclical ratio K of the signal Tun emitted by the output QL of the flip-flop RSL is equal to (t9−t5)/(t9−t1), i.e. K=0.5, when the first and second input signals Vdiv and Vref of the device for comparison are in phase opposition. In a situation of this type, which corresponds to the condition of balance, the average value of the charge current Ics is zero, and no correction is made to the oscillation frequency.

This figure also makes it possible to observe the reaction of the device for comparison in a situation in which its first and second input signals are no longer in phase opposition. In fact, in the example now described, the first input signal Vdiv has a leading edge at the instant tl2, which is logging in relation to the instant at which the second input signal Vref has a trailing edge, which means that the frequency of the first input signal Vdiv becomes too low. It is found that on completion of a sequence of events similar to that previously described, the output QL of the flip-flop RSL is at the logic level 1 for a time interval (t17−t13) with a duration shorter than the time interval (t9−t5). During this period (t17−t9), the cyclical ratio of the regulation signal Tun thus becomes lower than 0.5, which implies that the charge current Ics emitted by the charge pump CP will have a positive average value, whereas the frequency of the first input signal Vdiv will be lower than that of the second input signal Vref, thus giving rise to a charge of the capacitive element, which results in an increase in the value of the control signal taken from its terminals, in order to increase the value of the frequency of the said first signal Vdiv, such as to regain the condition of equilibrium.

What is claimed is:

1. A frequency synthesizer, including:
   an oscillator, which is designed to emit an output signal with an oscillation frequency which is controlled by means of a control signal; and
   a device for comparison, which is designed to receive a first input signal and a second input signal and to emit the control signal that is representative of a frequency difference between the first and second input signals, the first and second input signals comprising the output signal of the oscillator and a reference signal, respectively, the device including:
      a phase/frequency comparator, which is designed to receive the first and second input signals and to emit a first regulation signal;
      a lowpass filter responsive to the first regulation signal to produce a filtered first regulation signal;
      at least two current sources, each of which is designed to emit a charge current with a value that is variable according to the filtered first regulation signal; and
      a capacitive element, which is designed to have the charge current pass through it and to generate the control signal;
      wherein the phase/frequency comparator includes:
      a flip-flop RS, the inputs of which for setting to one and to zero are piloted respectively by the first and second input signals, and an output of which is designed to emit the control signal;
      a first and a second detector for active edges of the first and second input signals respectively, the outputs of which are connected to the inputs for setting to one and to zero of the flip-flop RS; and
      means for re-initialization of the first and second detectors, which are designed to deactivate one or the other of the detectors, when the active edge which it has detected has been taken into account by the flip-flop RS;
      the phase/frequency comparator being designed such that the first regulation signal comprises a succession of pulses, each of which has a width which is modulated according to the frequency difference which exists between said first and second input signals.

2. A frequency synthesizer as claimed in claim 1, which also includes a programmable divider, which is inserted between the oscillator and the device for comparison.

3. A device for comparison, which is designed to receive a first input signal and a second input signal, and to emit a control signal, which is representative of a frequency difference which exists between the first and second input signals, including:
   a phase/frequency comparator, which is designed to receive the first and second input signals, and to emit a first regulation signal;
   a lowpass filter responsive to the first regulation for producing a filtered first regulation signal;
   at least two current sources, each of which is designed to emit a charge current, with a value which is variable according to the filtered first regulation signal; and
   a capacitive element, which is designed to have the charge current pass through it and to generate the control signal;
   wherein the phase/frequency comparator includes:
      a flip-flop RS, the inputs of which for setting to one and to zero are piloted respectively by the first and second input signals, and an output of which is designed to emit the control signal;
      a first and a second detector for active edges of the first and second input signals respectively, the outputs of which are connected to the inputs for setting to one and to zero of the flip-flop RS; and
      means for re-initialization of the first and second detectors, which are designed to deactivate one or the other of the detectors, when the active edge which it has detected has been taken into account by the flip-flop RS;
      the phase/frequency comparator being designed such that the first regulation signal comprises a succession of pulses, each of which has a width which is modulated according to the frequency difference which exists between said first and second input signals.

4. A device designed for reception of radio signals, including:
   an input stage, which is designed to receive a radio signal, and to convert the radio signal into a first output signal, with a frequency known as a radio frequency;
   a frequency synthesizer including
      an oscillator, which is designed to emit a second output signal with an oscillation frequency, the oscillator controlled by means of a control signal; and
      a device for comparison, which is designed to receive a first input signal and a second input signal and to emit the control signal that is representative of a frequency difference between the first and second input signals, the first and second input signals comprising the output signal of the oscillator and a reference signal, respectively, the device including:
         a phase/frequency comparator, which is designed to receive the first and second input signals and to emit a first regulation signal;
         a lowpass filter responsive to the first regulation signal to produce a filtered first regulation signal;

at least two current sources, each of which is designed to emit a charge current with a value that is variable according to the filtered first regulation signal; and a capacitive element, which is designed to have the charge current pass through it and to generate the control signal;

wherein the phase/frequency comparator includes:

a flip-flop RS, the inputs of which for setting to one and to zero are piloted respectively by the first and second input signals, and an output of which is designed to emit the control signal;

a first and a second detector for active edges of the first and second input signals respectively, the outputs of which are connected to the inputs for setting to one and to zero of the flip-flop RS; and means for re-initialization of the first and second detectors, which are designed to deactivate one or the other of the detectors, when the active edge which it has detected has been taken into account by the flip-flop RS;

the phase/frequency comparator being designed such that the first regulation signal comprises a succession, of pulses, each of which has a width which is modulated according to the frequency difference which exists between said first and second input signals; and a mixer, which is designed to receive the output signals of the input stage and of the frequency synthesizer, and to emit a signal with a frequency which is equal to a difference between the radio frequency and the oscillation frequency.

* * * * *